United States Patent
Duncan et al.

(10) Patent No.: US 7,024,509 B2
(45) Date of Patent: Apr. 4, 2006

(54) PASSIVE RELEASE AVOIDANCE TECHNIQUE

(75) Inventors: Samuel H. Duncan, Arlington, MA (US); Steven Ho, Westford, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 570 days.

(21) Appl. No.: 09/944,515

(22) Filed: Aug. 31, 2001

(65) Prior Publication Data
US 2002/0091891 A1      Jul. 11, 2002

Related U.S. Application Data (60) Provisional application No. 60/229,830, filed on Aug. 31, 2000.

(51) Int. Cl.
G06F 13/36        (2006.01)
(52) U.S. Cl. .................. 710/311; 710/260; 710/48; 710/306
(58) Field of Classification Search ............. 710/311, 710/260, 48, 306
See application file for complete search history.

(56) References Cited

U.S. PATENT DOCUMENTS

| | | | | |
|---|---|---|---|---|
| 5,568,649 A | * | 10/1996 | MacDonald et al. | 710/48 |
| 5,588,125 A | * | 12/1996 | Bennett | 710/306 |
| 5,619,706 A | * | 4/1997 | Young | 710/268 |
| 5,771,387 A | * | 6/1998 | Young et al. | 710/260 |
| 5,875,341 A | | 2/1999 | Blank et al. | |
| 5,881,296 A | | 3/1999 | Williams et al. | |
| 5,892,956 A | * | 4/1999 | Qureshi et al. | 710/260 |
| 5,913,045 A | | 6/1999 | Gillespie et al. | |
| 5,933,613 A | | 8/1999 | Tanaka et al. | |
| 5,956,516 A | * | 9/1999 | Pawlowski | 710/260 |
| 6,021,456 A | | 2/2000 | Herdeg et al. | |
| 6,065,088 A | * | 5/2000 | Bronson et al. | 710/263 |

(Continued)

OTHER PUBLICATIONS de Gloria, Alessandro, et al., "A Self Timed Interrupt Controller: A Case Study in Asynchronous Micro-Architecture Design", Sep. 19-23, 1994, IEEE Seventh Annual International ASIC Conference and Exhibit, p. 296-299.*

(Continued)

Primary Examiner—Rehana Perveen
Assistant Examiner—Donna K. Mason (57) ABSTRACT

A system and method avoids passive release of interrupts in a computer system. The computer system includes a plurality of processors, a plurality of input/output (I/O) devices each capable of issuing interrupts, and an I/O bridge interfacing between the I/O devices and the processors. Interrupts, such as level sensitive interrupts (LSIs), asserted by an I/O device coupled to a specific port of the I/O bridge are sent to a processor for servicing by an interrupt controller, which also sets an interrupt pending flag. Upon dispatching the respective interrupt service routine, the processor generates two ordered messages. The first ordered message is sent to the I/O device that triggered the interrupt, informing it that the interrupt has been serviced. The second ordered message directs the interrupt controller to clear the respective interrupt pending flag. Both messages are sent, in order, to the particular I/O bridge port to which the subject I/O device is coupled. After forwarding the first message to the I/O device, the bridge port forwards the second message to the interrupt controller so that the interrupt can be deasserted before the interrupt pending flag is cleared.

17 Claims, 7 Drawing Sheets

U.S. PATENT DOCUMENTS

| | | | |
|---|---|---|---|
| 6,085,279 A | | 7/2000 | Suzuki |
| 6,108,741 A | * | 8/2000 | MacLaren et al. ........... 710/314 |
| 6,163,829 A | * | 12/2000 | Greim et al. ............... 710/260 |
| 6,173,351 B1 | * | 1/2001 | Garnett et al. .............. 710/309 |
| 6,192,425 B1 | * | 2/2001 | Sato ............................ 710/48 |
| 6,253,275 B1 | * | 6/2001 | Waldron et al. ............ 710/260 |
| 6,263,397 B1 | * | 7/2001 | Wu et al. ................... 710/268 |
| 6,442,634 B1 | * | 8/2002 | Bronson et al. ............ 710/260 |
| 6,587,868 B1 | * | 7/2003 | Porterfield .................. 709/203 |
| 6,604,161 B1 | * | 8/2003 | Miller ........................ 710/260 |
| 6,629,179 B1 | * | 9/2003 | Bashford .................... 710/260 |
| 2001/0027502 A1 | * | 10/2001 | Bronson et al. ............ 710/112 |
| 2001/0052043 A1 | * | 12/2001 | Pawlowski et al. ......... 710/260 |

OTHER PUBLICATIONS

Halang, Wolfgang A., et al., "A High-Precision Timing and Interrupt Controller to Support Distributed Real-Time Operating Systems," Aug. 13-16, 1995, Proceedings of the 38th Midwest Symposium on Circuits and Systems, vol. 1, p. 9-12.*

"PCI Local Bus Specification—Production Version," Jun. 1, 1995, Revision 2.1, p. 257-268.*

Interfacing the PC, Quality Information in one Place . . . , http://www.beyondlogic.org/interrupts/interrupt.htm, pp. 1-18.

An Introduction to Interrupts, http://goforit.unk.edu/asm/ints_1.htm, (co) 1988-2000, pp. 1-14.

* cited by examiner

PASSIVE RELEASE AVOIDANCE TECHNIQUE

CROSS-REFERENCE TO RELATED APPLICATIONS

The present application claims priority from U.S. Provisional Patent Application Ser. No. 60/229,830, which was filed on Aug. 31, 2000, by Sam Duncan, Dave Golden, Darrel Donaldson, Dave Hartwell, Steve Ho, Andrej Kovec, Jeff Willcox and Roger Pannell for a SYMMETRICAL MULTIPROCESSOR COMPUTER SYSTEM and is hereby incorporated by reference in its entirety.

BACKGROUND OF THE INVENTION

1. Field of the Invention

This invention relates to multiprocessor computer architectures and, more specifically, to the handling and processing of interrupts by multiprocessor computer systems.

2. Background Information

Distributed shared memory computer systems, such as symmetrical multiprocessor (SMP) systems, support high performance application processing. Conventional SMP systems include a plurality of processors coupled together by a bus. One characteristic of SMP systems is that memory space is typically shared among all of the processors. That is, each processor accesses programs and data in the shared memory, and processors communicate with each other via that memory (e.g., through messages and status information left in shared address spaces). In some SMP systems, the processors may also be able to exchange signals directly. One or more operating systems are typically stored in the shared memory. These operating systems control the distribution of processes or threads among the various processors. The operating system kernels may execute on any processor, and may even execute in parallel. By allowing many different processors to execute different processes or threads simultaneously, the execution speed of a given application may be greatly increased.

During operation, entities or "agents" of the computer system often generate interrupt signals in response to a need for service or the detection of an error by those entities or agents, which may include processors, memory controllers, inputloutput (I/O) devices, etc. For example, when an I/O device requests some particular type of service or action from a processor, it often signals the processor by issuing an interrupt. Specifically, the I/O device may assert an interrupt input pin of either the processor or an interrupt controller, which forwards the interrupt to the processor. Provided the interrupt is permitted, it will be acknowledged by the processor at the end of the current processor cycle. The processor then services the interrupt typically by branching to a special service routine written to handle that particular interrupt. Upon servicing the interrupt, the processor signals the I/O device that it completed the interrupt, typically with a write to the device, and the I/O device deasserts the interrupt signal. The processor then signals to the interrupt controller that the interrupt event has been serviced, typically with an end of interrupt signal.

Multiprocessor, distributed memory systems may have many I/O devices generating large numbers of interrupts. The Peripheral Component Interface (PCI) specification standard, for example, defines four level sensitive interrupts (INTA, INTB, INTC and INTD) that can be generated by a single, multifunction, I/O device. In many computer systems, the number of interrupts that can be supported is limited. As a result, a given interrupt signal, especially a level sensitive interrupt (LSI), may be shared by more than one I/O device. If two devices are asserting a given LSI, it will remain asserted until both devices have been serviced.

The process of collecting interrupts and sending them to the processors for servicing can be complex. Inefficient processing of interrupts can result in reduced efficiency of the system. For example, in some implementations, it is possible for the end of interrupt to be detected prior to the I/O device deasserting the interrupt signal. This may cause the system to believe the interrupt signal has been asserted a second time even though there is no work to be done. Because interrupt signals can be shared, it is not sufficient simply to wait for the interrupt signal to be deasserted as a second interrupt may be signaled immediately after the first and/or may overlap with the prior interrupt, resulting in a continuously asserted interrupt signal. The occurrence of interrupt signaling when no service is actually requested is known as "passive release", and reduces the efficiency of the computer system. However, Prior art computer systems were built to expect and tolerate the passive release of interrupts, even though this would result in degraded system performance. Accordingly, a need exists for efficiently collecting and processing interrupts in large, multiprocessor computer systems.

SUMMARY OF THE INVENTION

Briefly, the present invention is directed to a system and method for avoiding passive release of interrupts in a multiprocessor computer system. The computer system includes a plurality of processors, a memory subsystem, a plurality of input/output (I/O) devices each capable of issuing interrupts, and an I/O bridge interfacing between the I/O devices and the processors. The I/O bridge includes a plurality of data ports for connecting to the I/O devices themselves, and an interrupt port for collecting the interrupts generated by the I/O devices. The I/O devices initiate interrupts by asserting an interrupt signal, such as a level sensitive interrupt (LSI) wire or line that leads to the interrupt port.

Upon detecting the assertion of an interrupt signal, the interrupt controller generates a write message containing the interrupt and sends it to a designated processor for servicing the interrupt. The interrupt controller then sets an interrupt pending flag associated with the interrupt. The designated processor services the interrupt and generates a first write message that is directed to the I/O device that initiated the interrupt. The processor designates the first write message as an ordered transaction and sends it to the port of the I/O bridge to which the device is coupled. The processor also generates a second, ordered write message. The second write message directs the interrupt controller to clear the interrupt pending flag that was set in response to the interrupt from the I/O device. The processor also sends the second write message to the port to which the I/O device is coupled, after sending the first write message.

The first and second write messages are received at the respective port of the I/O bridge, which includes an ordering engine that maintains the order of messages received from the processors. Since it was received first, the ordering engine forwards the first write message to the I/O device, which responds by deasserting the interrupt signal. After forwarding the first write message, the ordering engine then passes the second write message to the interrupt controller at the I/O bridge's interrupt port. The interrupt controller responds by clearing the interrupt pending flag.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
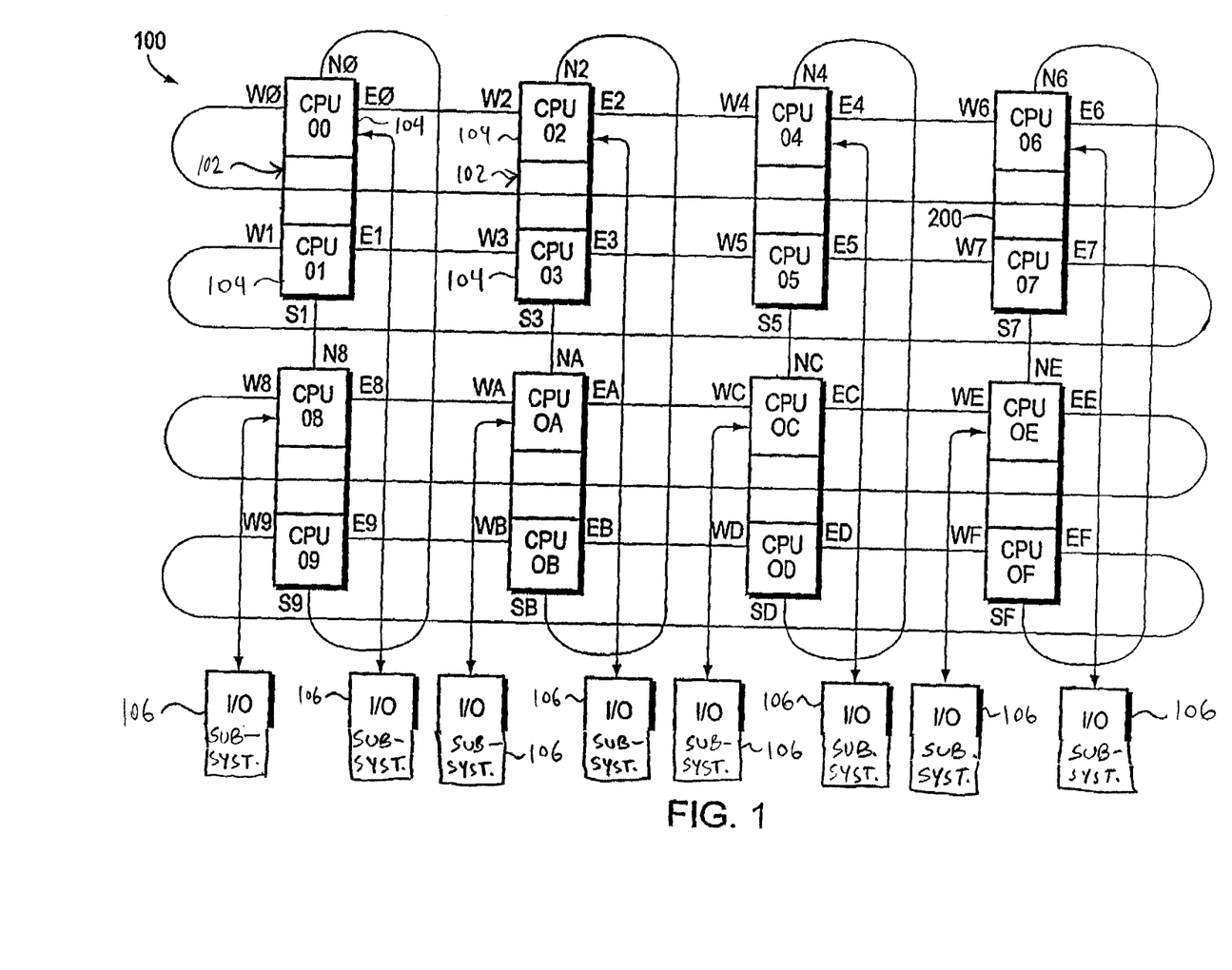
FIG. 1 is a schematic block diagram of a symmetrical multiprocessor computer system in accordance with the present invention.

FIG. 1 is a schematic block diagram of a symmetrical multiprocessor (SMP) system 100 comprising a plurality of processor modules 102 interconnected to form a two dimensional (2D) torus or mesh configuration. Each processor module 102 preferably comprises two central processing units (CPUs) or processors 104 and has connections for two input/output (I/O) ports (one for each processor 104) and six inter-processor (IP) network ports. The IP network ports are preferably referred to as North (N), South (S), East (E) and West (W) compass points and connect to two unidirectional links. The North-South (NS) and East-West (EW) compass point connections create a (manhattan) grid, while the outside ends wrap-around and connect to each other, thereby forming the 2D torus. The SMP system 100 further comprises a plurality of I/O subsystems 106. I/O traffic enters the processor modules 102 of the 2D torus via the I/O ports. Although only one I/O subsystem 106 is shown connected to each processor module 102, because each processor module 102 has two I/O ports, any given processor module 102 may be connected to two I/O subsystems 106 (i.e., each processor 104 may be connected to its own I/O subsystem 106).

Figure 2:
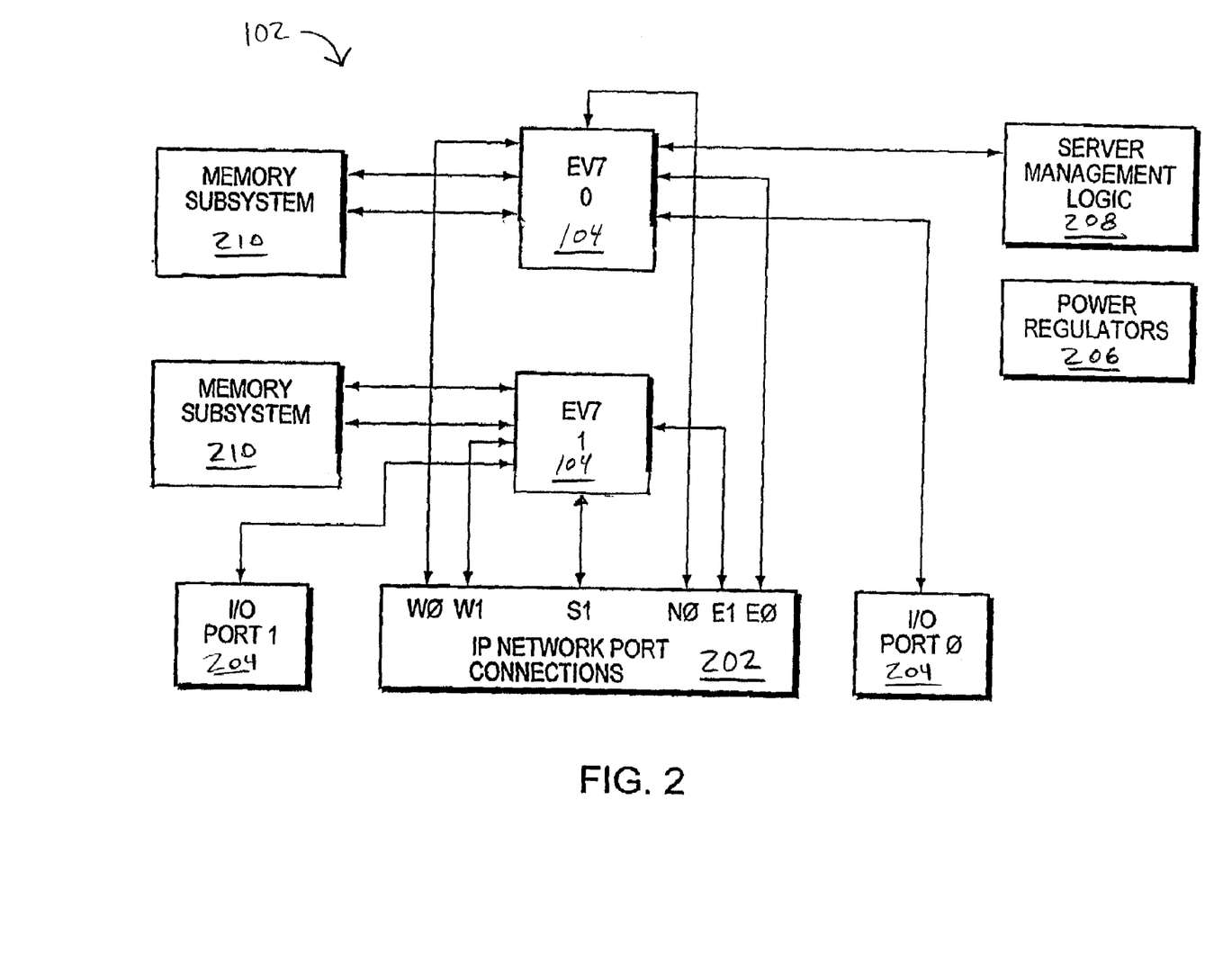
FIG. 2 is a schematic block diagram of a dual processor module of the computer system of FIG. 1.

FIG. 2 is a schematic block diagram of a dual CPU (2P) module 102. As noted, each 2P module 102 preferably has two CPUs 104 each having connections 202 for the IP ("compass") network ports and an I/O port 204. The 2P module 102 also includes one or more power regulators 206, server management logic 208 and two memory subsystems 210 each coupled to a respective memory port (one for each CPU 104). The server management logic 208 cooperates with a server management system to control functions of the computer system 100 (FIG. 1), while the power regulators 206 control the flow of electrical power to the 2P module 102. Each of the N, S, E and W compass points along with the I/O and memory ports, moreover, preferably use clock-forwarding, i.e., forwarding clock signals with the data signals, to increase data transfer rates and reduce skew between the clock and data.

Each CPU 104 of a 2P module 102 is preferably an "EV7" processor from Compaq Computer Corp. of Houston, Tex., that includes part of an "EV6" processor as its core together with "wrapper" circuitry that comprises two memory controllers, an I/O interface and four network ports. In the illustrative embodiment, the EV7 address space is 44 physical address bits and supports up to 256 processors 104 and 256 I/O subsystems 106. The EV6 core preferably incorporates a traditional reduced instruction set computer (RISC) load/store architecture. In the illustrative embodiment described herein, the EV6 core is an Alpha® 21264 processor chip manufactured by Compaq Computer Corporation of Houston, Tex., with the addition of a 1.75 megabyte (MB) 7-way associative internal cache and "CBOX", the latter providing integrated cache controller functions to the EV7 processor. The EV7 processor also includes an "RBOX" that provides integrated routing/networking control functions with respect to the compass points, and a "ZBOX" that provides integrated memory controller functions for controlling the memory subsystem 370. However, it will be apparent to those skilled in the art that other types of processor chips may be advantageously used.

Each memory subsystem 210 may be and/or may include one or more conventional or commercially available dynamic random access memory (DRAM), synchronous DRAM (SDRAM), double data rate SDRAM (DDR-SDRAM) or Rambus DRAM (RDRAM) memory devices.

Each CPU 104 of the multiprocessor system 100 also includes a plurality of internal control and status registers (CSRs). For example, each CPU has an internal interrupt queue register (not shown) for storing interrupts to be serviced by the processor.

Figure 3:
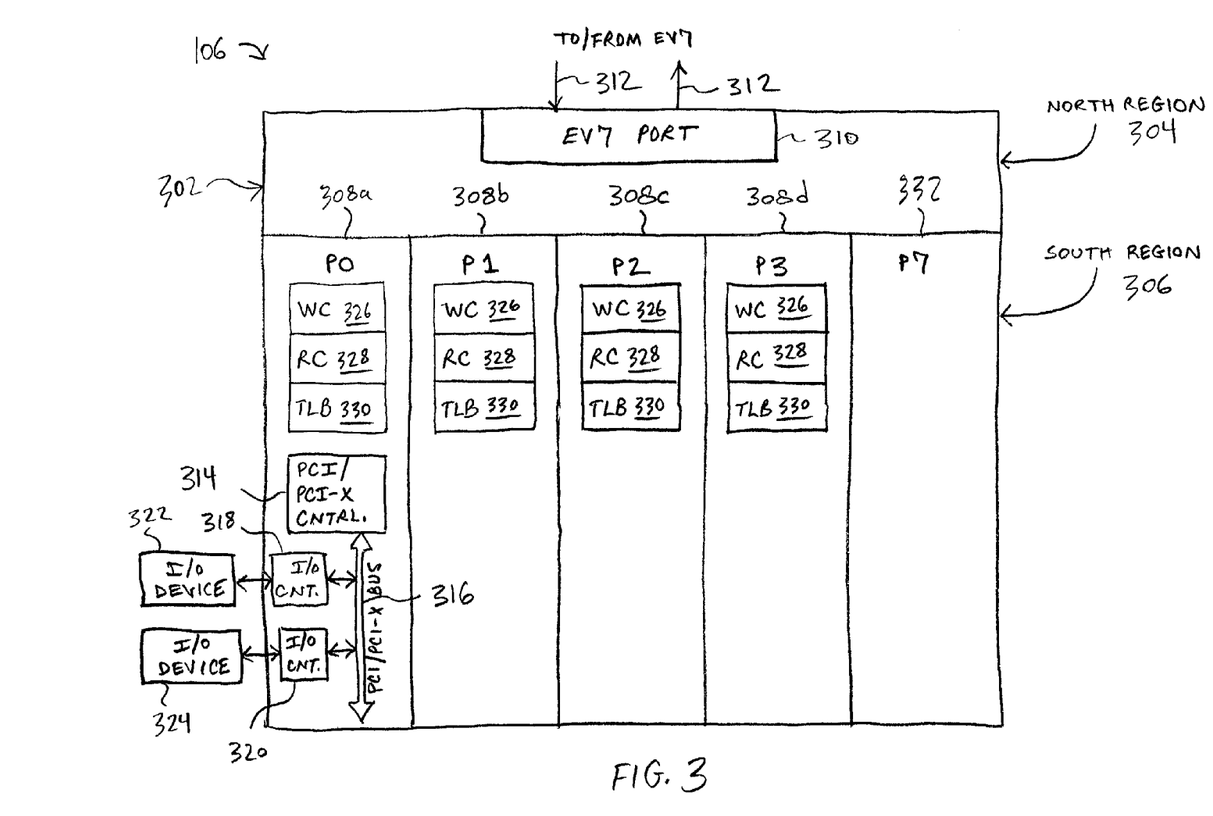
FIG. 3 is a schematic block diagram of an I/O subsystem of the computer system of FIG. 1.

FIG. 3 is a schematic block diagram of an I/O subsystem 106. The subsystem 106 includes an I/O bridge 302, which may be referred to as an "IO7", that constitutes a fundamental building block of the I/O subsystem 106. The IO7 302 is preferably implemented as an application specific integrated circuit (ASIC). As described above, each EV7 processor 104 includes one I/O port 204; however, there is no requirement that each processor 104 be connected to an I/O subsystem 106.

The IO7 302 comprises a North circuit region 304 that interfaces to the EV7 processor 104 and a South circuit region 306 that includes a plurality of I/O data ports 308a–d (P0–P3) that preferably interface to standard I/O buses. An EV7 port 310 of the North region 304 couples to the EV7 processor 104 via two unidirectional, clock forwarded links 312. In the illustrative embodiment, three of the four I/O data ports 308a–c interface to the well-known Peripheral Component Interface (PCI) and/or PCI-Extended (PCI-X) bus standards, while the fourth data port 304d interfaces to an Accelerated Graphics Port (AGP) bus standard. More specifically, ports P0–P2 include a PCI and/or PCI-X controller, such as controller 314 at port P0, which is coupled to and controls a respective PCI and/or PCI-X bus, such as bus 316. Attached to bus 316 may be one or more I/O controller cards, such as controllers 318, 320. Each I/O controller 318, 320, in turn, interfaces to and is responsible for one or more I/O devices, such as I/O devices 322 and 324. Port P3 may include an AGP controller (not shown) rather than a PCI or PCI-X controller for controlling an AGP bus.

A cache coherent domain of the SMP system 100 preferably extends into the IO7 302 and, in particular, to I/O buffers or caches located within each I/O data port 308 of the IO7 302. Specifically, the cache coherent domain extends to a write cache (WC) 326, a read cache (RC) 328 and a translation look-aside buffer (TLB) 330 located within each I/O data port 308. The WC 326 and RC 328, as well as TLB 466 function as coherent buffers.

The South region 306 further includes an interrupt port 332 (P7). The interrupt port P7 collects PCI and/or AGP level sensitive interrupts (LSIs) and message signaled interrupts (MSIs) generated by I/O devices coupled to the other south ports P0–P3, and sends these interrupts to North region 306 for transmission to and servicing by the processors 104 of the EV7 mesh. The interrupt port P7 also collects errors generated within the North and South regions 304, 306 of the IO7 302.

Figure 4:
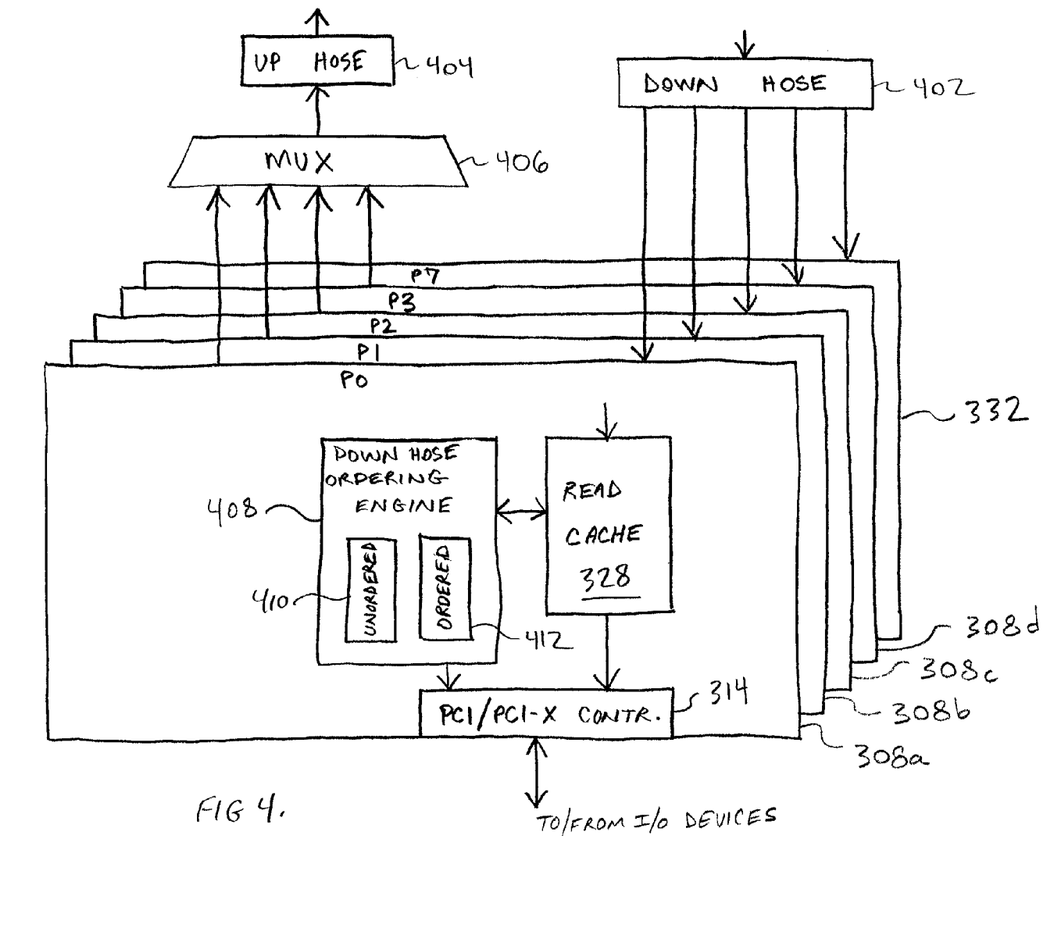
FIG. 4 is a schematic block diagram of a data port of the I/O subsystem of FIG. 3.

FIG. 4 is a schematic block diagram of port P0 in greater detail. Port P0 is coupled to a down hose 402 for receiving information from the EV7 mesh and an up hose 404 for sending information into the EV7 mesh. Port P0 as well as ports P1–P3 and P7 are coupled to the up hose 404 through a multiplexer (MUX) 406, which provides a single output to North region 304. Messages generated within any of the south ports P0–P3 and P7 are received by and processed by the MUX 406 before transmission to North region 304 (FIG. 3) and the EV7 mesh. The MUX 406 may include an up hose arbitration (arb) logic circuit.

Information received from the down hose 402 for port P0 is buffered at the read cache (RC) 328 which is configured to have a plurality of entries. Port P0 further includes a down hose ordering engine 408 which is operatively coupled to the RC 328. The down hose ordering engine 408 maintains an index of the information contained in the RC 328, including whether that information corresponds to ordered or unordered transactions. Specifically, the down hose ordering engine 408 has an unordered queue 410 and an ordered queue 412, which it uses to determine the order in which information in the RC 328 may be released to the intended recipient, e.g., an I/O device. For example, upon receiving information from the down hose 402 and buffering that information in the RC 328, the down hose ordering engine sets a corresponding flag in the unordered queue 410 or in the ordered queues 412, depending on whether the received information corresponds to an unordered or an ordered transaction.

If the information buffered at a particular entry of the RC 328 corresponds to an ordered transaction, then the down hose ordering engine 408 blocks the release of that information until all ordered transactions that were received earlier in time have been processed. Once all of the prior ordered transactions have been processed, the down hose ordering engine 408 releases, e.g., makes "visible", the subject information to the intended recipient.

Figure 5:
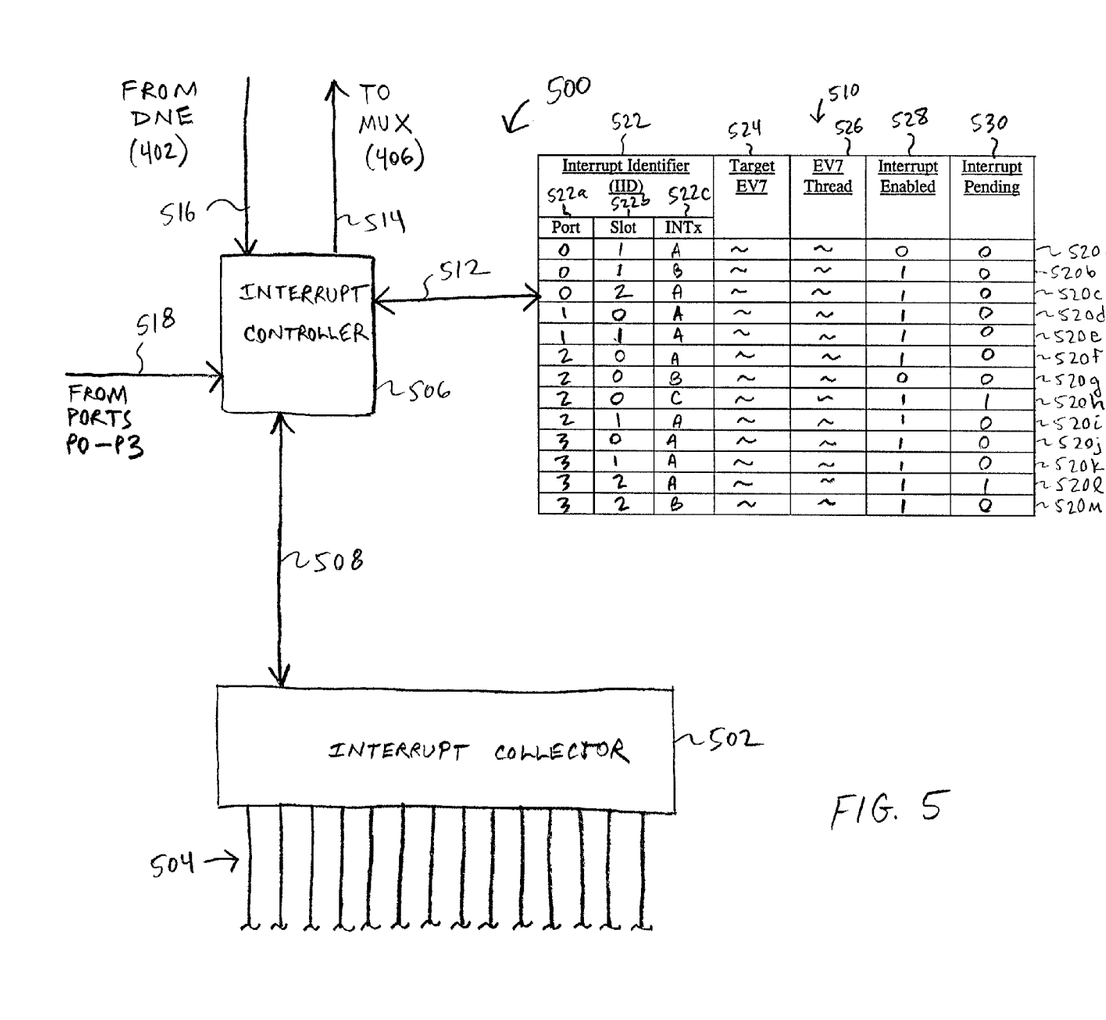
FIG. 5 is a highly schematic block diagram of an interrupt control system in accordance with the present invention.

FIG. 5 is a schematic block diagram of a preferred interrupt control system 500 which may be, at least in part, advantageously disposed at the interrupt port P7 of the IO7 302. The interrupt control system 500 includes an interrupt collector 502 having a plurality of interrupt wires or lines 504 for receiving interrupt signals, such as level sensitive interrupts (LSIs), from the I/O devices that may be coupled to the respective IO7 302. Operatively coupled to the interrupt collector 502 is an interrupt controller 506. The interrupt controller 506 is preferably programmed to periodically poll the interrupt collector 502 to determine which lines or wires 504 are asserted, and to retrieve that information, as indicated by arrow 508. The interrupt controller 506 also has access to a LSI register file 510. As described below, the interrupt controller 506 can read from and write to the LSI register file 510, as indicated by arrow 512.

It should be understood that more than one I/O device may be connected to a given wire or line 504 leading into the interrupt collector 502. That is, interrupt lines 504 can be shared among multiple devices and/or among different functions of multifunction devices.

The interrupt controller 506 is also configured to generate interrupt messages or transactions, such as Write Internal Processor Register (WrIPR) messages or transactions, and send them to the MUX 406 (FIG. 4) for transmission, via the IO7's North region 304, into the EV7 mesh, as indicated by arrow 514. The interrupt controller 506 can also receive messages from the EV7 mesh as indicated by arrow 516. In addition, the interrupt controller 506 may receive messages from the other ports P0–P3 of the IO7, as indicated by arrow 518.

The LSI register file 510 is preferably arranged, at least logically, as a table array having a plurality of columns and rows whose intersections define corresponding cells for storing information. In particular, the LSI register file 510 has a plurality of rows 520a–m corresponding to a wire or line 504 leading into the interrupt collector 502. The LSI register file 510 also has a plurality of columns for organizing information associated with each row 520a–m. Specifically, the LSI register file 510 has a first column 522 that contains a unique number for each row 520a–m. The interrupt number 522 may comprise three parts: a port ID 522a, a slot ID 522b and an interrupt designator (INTX) 522c. A second column 524 contains the identity of the target EV7 processor 104 that is to process the interrupt service routine of the interrupt identified by the respective row 520a–m. A third column 526 contains the thread of the EV7 processor 104 that is to process the interrupt service routine. A fourth column 528 indicates whether the interrupt of the respective row 520a–m is enabled or disabled. For example, the fourth column 528 may be 1-bit. If the bit is asserted (e.g., set to "1") the respective interrupt is enabled. If the bit is de-asserted (e.g., set to "0"), the interrupt is disabled. A fifth column 530 indicates whether the respective interrupt is pending. Fifth column 530 may also be 1-bit and, if asserted, indicates that the interrupt is pending. If it is de-asserted, it indicates that the interrupt is not pending.

The LSI register file 510 is preferably implemented as one or more registers disposed at the IO7 302. These registers may be written to by the corresponding interrupt controller 506, by other IO7s of the SMP system 100 and/or by one or more of the processors 104. Nonetheless, those skilled in the art will recognize that the LSI register file 510 may be implemented in other ways, such as through one or more memory devices, e.g., RAM.

Figure 6A:
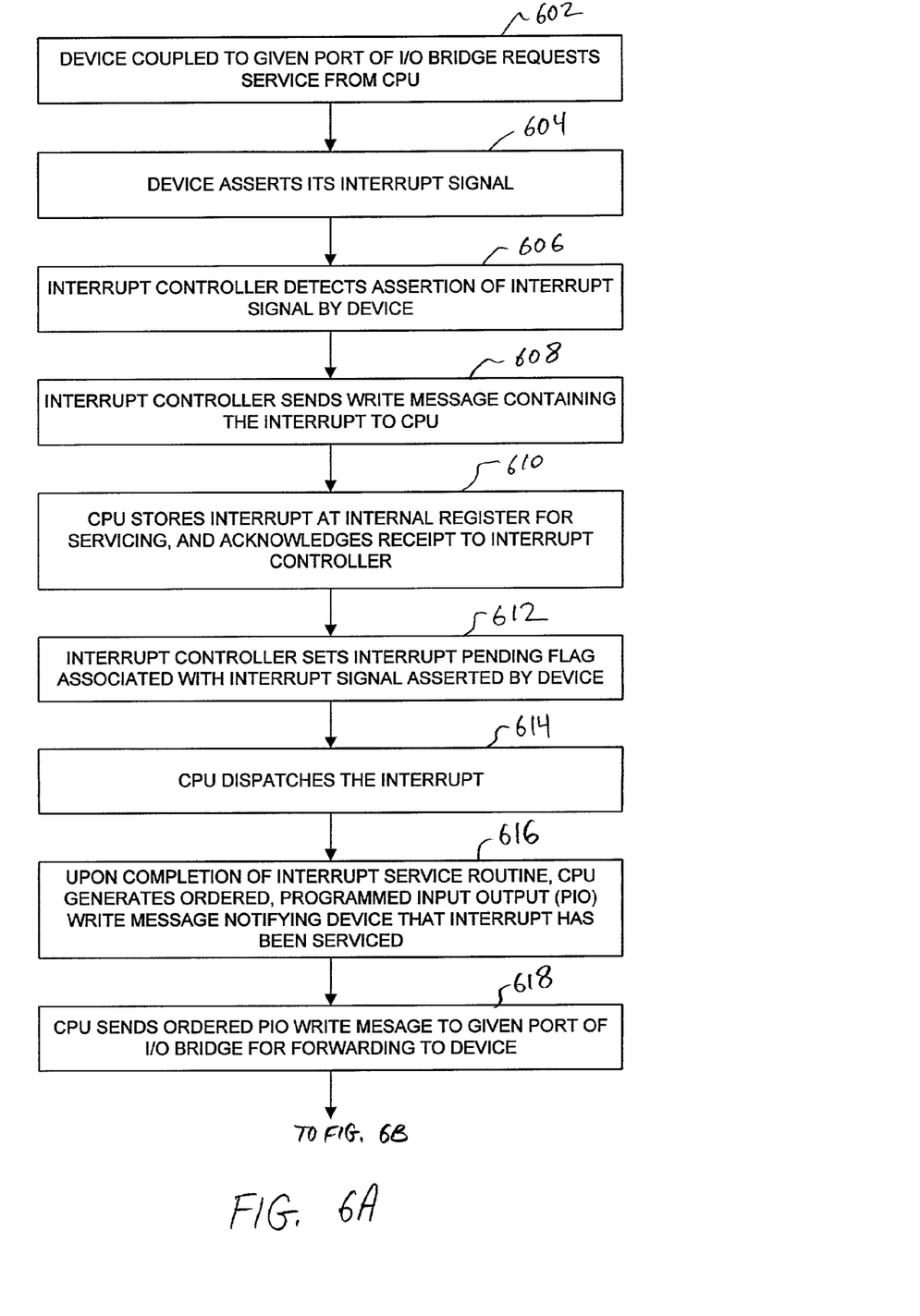
FIGS. 6A–B are a flow diagram of the method of the present invention.
Figure 6B:
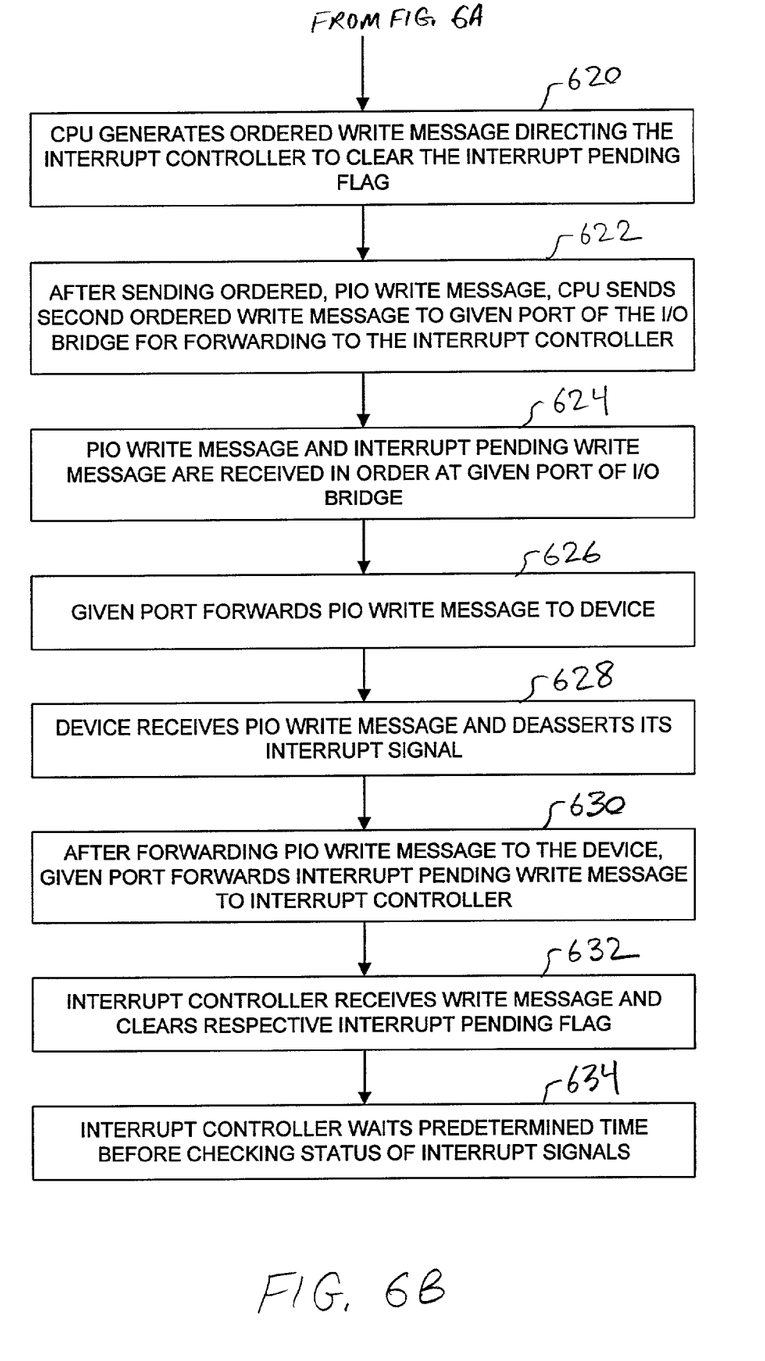

FIGS. 6A and 6B is a flow diagram of the method of the present invention. Suppose a device, such as I/O device 324 (FIG. 3), at a given port of an I/O bridge, e.g., port P0 (FIG. 3) of the IO7 302 requires some type of service from the EV7 mesh, as indicated at block 602. The I/O device 324 preferably signals a level sensitive interrupt (LSI) by asserting the signal of its wire or line 504 (FIG. 5) leading to the interrupt collector 502 to the specified LSI level, as indicated at block 604. According to the PCI specification standard, LSIs are asserted low, i.e., negative true. Alternatively, I/O device 324 may issue a message signaled interrupt (MSI). During the next polling cycle, the interrupt controller 506 will "see" that a signal is present on a given line 504. This condition is detected by the interrupt controller 506, as indicated at block 606. For example, the levels of the wires or lines 504 may be captured by the interrupt collector 502 and moved to the interrupt controller 506 by one or more shift operations, utilizing one or more shift registers.

Specifically, the interrupt collector 502 may include a parallel-load, serial shift register (not shown). The interrupt controller 506 periodically issues a signal to the collector 502 to load the register. The register is loaded in response to one or more interrupt lines 504 being asserted. The contents of the register are then serially shifted into the interrupt controller 506, i.e., into the IO7 302. In this manner, the IO7 302 can sample a large number of interrupt states, e.g., 32 per port P0–P3, with only a small number of pins, e.g., 3 pins. Each pin preferably supports 32-bits of interrupt state data. Each port P0–P3, moreover, preferably provides eight available slots and, under the PCI specification standard, each slot must be able to accept four interrupt signals, e.g., INTA, INTB, INTC and INTD. More than one cycle may be required to shift the contents of this register into the interrupt controller 506. Preferably, the interrupt controller determines which interrupts have been enabled based on the information at column 528 of the LSI register file 510, and only clocks the register a sufficient number of times to retrieve data for the enabled interrupts.

In response to detecting the presence of an interrupt, the interrupt controller 506 indexes to the appropriate entry or row, e.g., row 520*i*, of the LSI register file 510, which controls how the LSIs are processed. The controller 506 may first determine whether this particular interrupt is enabled by examining the corresponding entry from the interrupt enabled column 528 for row 520*i*. If the interrupt is not enabled, the interrupt controller 506 stops. Assuming the interrupt is enabled, the interrupt controller 506 next examines the corresponding entry from the interrupt pending column 530 for entry 520*i*. This entry should be "0", unless some other I/O device connected to this same wire or line 504 already has an interrupt outstanding.

The interrupt controller 506 then proceeds to post the interrupt from I/O device 324 to the EV7 mesh, as indicated at block 608. Specifically, the interrupt controller 506 generates a write message, such as a WrIPR message, that is directed to the interrupt queue register at the target EV7 processor 104 that is to service this interrupt. The interrupt controller 506 identifies the appropriate processor from the respective entry at the target EV7 column 524 for row 520*i*. Appended to the WrIPR is an interrupt identifier (IID), which the interrupt controller 506 generates by concatenating the following information:

| Interrupt Number | EV7 Thread | IO7 ID |
|---|---|---|

The interrupt number and EV7 thread are obtained from columns 522 and 524 of the LSI register file 510 for entry 520*i*. The interrupt controller 506 may be preconfigured with or otherwise have access to the ID of the IO7.

The interrupt controller 506 sends the message by passing it, via the MUX 406 (FIG. 4), into the North region 304 from where it is sent via link 312 into the EV7 mesh. Within the EV7 mesh, the message is routed to the target processor 104 by means of the RBOX and the inter-processor (IP) network ports 202 of the various processors. Upon receiving the WrIPR message from the interrupt controller 506, the target processor 104 stores the interrupt at its interrupt queue register, as indicated at block 610. The target processor 104 also issues an acknowledgment message, such as a Write Input/Output Acknowledgment (WrIOAck) message, to the interrupt controller 506 at the IO7 302 to acknowledge its receipt of the interrupt, as also indicated at block 610.

In response to the WrIOAck message, the interrupt controller 506 asserts the interrupt pending entry 530 for row 520*i* to reflect that the respective interrupt is pending service, as indicated at block 612. The target processor 104 then services, e.g., dispatches, the interrupt, as indicated at block 614. To dispatch the interrupt, the target processor 104 preferably obtains the appropriate interrupt vector by using the IID as an index, and executes the corresponding interrupt service routine. Upon completing the steps of the interrupt service routine, the target processor 104 generates an ordered message or transaction, such as an ordered, programmed IO (PIO) message, informing the I/O device 324 that the processor has discharged the interrupt, as indicated at block 616. The target processor 104 then sends this ordered message to the I/O device 324 by directing it to port P0 of the IO7 302, as indicated at block 618.

Within the SMP system 100, a message may be designated and thus recognized as either ordered or unordered by system agents, including the south ports of an IO7 302, in several ways. For example, the SMP system 100 may be configured such that all messages of a given type, e.g., all write messages, are processed in order. Alternatively, one or more fields and/or bits of a given message may be set in a predetermined manner, thereby designating the message as an ordered or an unordered message.

In addition to the ordered PIO message, the target processor 104 generates a second ordered write message or transaction, such as an End of Interrupt (EOI) message, that directs the interrupt controller 506 at the IO7 302 to clear the interrupt pending flag from column 530 for entry 520*i*, as indicated at block 620 (FIG. 6B). As described above, the interrupt pending flag is set in response to receiving a WrIOAck message from the target processor 104. This second write message has two significant characteristics. First, it is an ordered message that is sent only after the first write message is sent to the I/O device 324, as indicated at block 622. Second, it is sent to the port, e.g., port P0, to which the I/O device 324 is coupled, and not to port P7 at which the interrupt controller 506 is located, as also indicated at block 622. The second write message is sent to port P0 even though it writes to a register disposed, at least logically, at port P7 and/or is intended to be read and acted upon by the interrupt controller 506 at port P7, rather than by some component disposed at port P0.

The two ordered write message are received at the IO7 302 in the same order in which they were sent via down hose 402, and, due to the way in which they were addressed by the target processor 104, they are both are passed to port P0 for processing, as indicated at block 624. The messages are buffered in the read cache 328 and, since they are both ordered messages, two respective flags are set in the ordered queue 412 to ensure that the first message is processed before the second.

In particular, port P0 transmits the first ordered message, i.e., the PIO message, to I/O device 324, as indicated at block 626. In particular, port P0 hands the message to the PCI controller 314 which drives it onto the PCI bus 316 for receipt by device 324. Device 324 receives the PIO message which informs it that the EV7 mesh has serviced its interrupt. In response, device 324 deasserts its interrupt line 504, as indicated at block 628. After sending the first ordered message, e.g., after driving the message onto the PCI bus 316, port P0 sends the second ordered message buffered at the read cache 328 over to port P7, as indicated at block 630. That is, the ordering engine 408 recognizes the target of the second message as port P7, but must wait until all ordered transaction received earlier in time, including the PIO message, have been processed before sending the second message to port P7. As the IO7 302 is preferably an ASIC, the second ordered message is transmitted to port P7 via an internal communication facility of the ASIC, such as a wire or line.

The second message instructs the interrupt controller 506 to deassert the interrupt pending entry of column 530 for row 520*i*, as indicated by block 632, thereby reflecting that the respective interrupt has been dispatched. In the preferred embodiment, the interrupt controller 506 then waits a predetermined time, e.g., one or more clock cycles, before again checking the status of the interrupt lines 504 leading to the interrupt collector 502, as indicated at block 634. This ensures that the I/O device 324 has sufficient time to receive the first write message off of the PCI bus 316 and to deassert its interrupt line 504. Accordingly, if the same interrupt line 504 is still asserted even after waiting the predetermined time, then the interrupt controller 506 knows that it is the result of some other interrupt, e.g., an interrupt issued by another device, e.g., I/O device 322, which shares this same interrupt line 504, or another request for service by the same device, i.e. I/O device 324.

As shown, by issuing two ordered messages to the port to which the respective I/O device is coupled, the present invention ensures that the I/O device will deassert its interrupt signal before the EOI message is received and processed at the interrupt controller 506. As a result, the passive release of interrupts is avoided. Thus, system resources are not spent attending to interrupts that have already been dispatched.

It should be understood that the two write message may generated by the target processor 104 in any order but must be sent in the order described above. As indicated above, moreover, the second write message may clear the interrupt pending flag directly or it may be a command message directing the interrupt controller 506 to clear the flag. That is, the second message may be a write transaction targeting the respective IO7 register at which the respective interrupt pending flag is stored.

It should be further understood that the interrupt controller 506, after receiving the second write message, need not wait the predetermined time before polling the interrupt collector 502 again.

It should also be understood that the SMP system 100 may take other forms besides a 2D torus.

The foregoing description has been directed to specific embodiments of the present invention. It will be apparent, however, that other variations and modifications may be made to the described embodiments, with the attainment of some or all of their advantages. For example, the present invention could be implemented in single processor computer systems. Therefore, it is the object of the appended claims to cover all such variations and modifications as come within the true spirit and scope of the invention.

The invention claimed is:

1. A method for preventing passive release of interrupts within a computer system, the computer system having at least one processor for servicing the interrupts, one or more input/output (I/O) devices configured to issue interrupts, and an I/O bridge having a plurality of ports to which I/O devices are coupled and configured to interface between the I/O devices and the processor, the method comprising the steps of:
    asserting an interrupt signal by a subject I/O device coupled to a given port of the I/O bridge;
    forwarding an interrupt message corresponding to the interrupt signal to the processor for servicing;
    setting an interrupt pending flag in response to assertion of the interrupt signal;
    in response to the interrupt being serviced, generating a first ordered message, the first ordered message notifying the subject I/O device that the interrupt has been serviced;
    generating a second ordered message for clearing the interrupt pending flag;
    sending the first ordered message to the given port of the I/O bridge;
    sending the second ordered message to the given port of the I/O bridge after the first message has been sent;
    deasserting the interrupt signal in response to the first message; and
    clearing the interrupt pending flag in response to the second ordered message.

2. The method of claim 1 further comprising the step of forwarding the first ordered message from the given I/O bridge port to the subject I/O device.

3. The method of claim 2 wherein the step of deasserting the interrupt signal is performed by the subject I/O device following its receipt of the first ordered message.

4. The method of claim 3 wherein one of the ports of the I/O bridge is an interrupt port and the interrupt pending flag is disposed at the interrupt port, the method further comprising the step of forwarding the second ordered message from the given I/O bridge port to the interrupt port.

5. The method of claim 4 wherein
    the interrupt pending flag is implemented through a register of the interrupt port; and
    the second ordered message is a write transaction to the register for clearing the interrupt pending flag.

6. The method of claim 5 further comprising the steps of:
    periodically collecting a set of information regarding the assertion of interrupt signals by I/O devices; and
    after the step of clearing the interrupt pending flag, waiting a predetermined time before collecting a next set of information regarding the assertion of interrupt signals.

7. The method of claim 6 wherein the step of periodically collecting is performed through one or more serial data transfer operations.

8. The method of claim 1 wherein the steps of generating the first and second ordered messages are performed by the processor.

9. The method of claim 8 wherein the computer system includes (1) a plurality of processors at least one of which is designated to service interrupts from the subject I/O device, and (2) a plurality of I/O bridges each I/O bridge coupled to a plurality of I/O devices configured to assert respective interrupt signals.

10. The method of claim 1 wherein the interrupt signals are level sensitive interrupts (LSIs).

11. A computer system comprising:
    a plurality of input/output (I/O) devices configured to assert and deassert respective interrupt signals;
    at least one processor for servicing interrupts from the I/O devices; and
    an I/O bridge configured to interface between the I/O devices and the at least one processor, the I/O bridge having a plurality of ports to which the I/O devices are coupled and an interrupt controller configured to detect the assertion and deassertion of the interrupt signals, wherein
    the interrupt controller, in response to assertion of an interrupt signal by a subject I/O device coupled to a given port of the I/O bridge, issues an interrupt message to the at least one processor and sets an interrupt pending flag;
    the at least one processor, upon servicing the interrupt, sends first and second ordered messages to the given port of the I/O bridge, the first ordered message notifying the subject I/O device that the interrupt has been serviced, and the second ordered message clearing the interrupt pending flag;
    the subject I/O device deasserts the interrupt signal in response to the first message; and
    the interrupt pending flag is cleared in response to the second ordered message.

12. The computer system of claim 11 wherein
one of the ports of the I/O bridge is an interrupt port at which the interrupt controller is disposed, and
the given port of the I/O bridge forwards the second ordered message to the interupt port after forwarding the first ordered message to the subject I/O device.

13. The computer system of claim 12 wherein the interrupt port of the I/O bridge includes at least one register at which the interrupt pending flag is implemented.

14. The computer system of claim 11 wherein
the I/O bridge port includes a read cache for buffering messages received from the at least one processor, and
an ordering engine operatively coupled to a read cache, and
the ordering engine is configured to release ordered messages buffered in the read cache in the same order as which they were received.

15. The computer system of claim 11 further comprising an interrupt collector having a parallel-load shift register for receiving the interrupt signals from the I/O devices, the parallel-load shift register configured to transfer information indicating the assertion or deassertion of interrupt signals to the interrupt controller through one or more serial shift operations.

16. The computer system of claim 15 wherein
the interrupt collector transfers the information in response to a request from the interrupt controller, and
the interrupt controller is configured to limit the number of serial shift operations performed by the interrupt collector so as to receive only information associated with interrupt signals that have been enabled.

17. The computer system of claim 11 wherein the interrupt signals are level sensitive interrupts (LSIs).

* * * * *

UNITED STATES PATENT AND TRADEMARK OFFICE
CERTIFICATE OF CORRECTION

PATENT NO. : 7,024,509 B2  
APPLICATION NO. : 09/944515  
DATED : April 4, 2006  
INVENTOR(S) : Samuel H. Duncan et al.

It is certified that error appears in the above-identified patent and that said Letters Patent is hereby corrected as shown below:

In column 11, line 5, in Claim 12, delete "interupt" and insert -- interrupt --, therefor.

Signed and Sealed this

Second Day of June, 2009

JOHN DOLL  
*Acting Director of the United States Patent and Trademark Office*